United States Patent [19]

Steinbrecher et al.

[11] Patent Number: 5,121,051

[45] Date of Patent: Jun. 9, 1992

[54] METHOD AND APPARATUS FOR MEASURING SMALL ELECTRICAL SIGNALS

[75] Inventors: Jürgen Steinbrecher, Felsberg/Gensungen; Ulrich Schnell, Baunatal, both of Fed. Rep. of Germany

[73] Assignee: U.S. Philips Corporation, New York, N.Y.

[21] Appl. No.: 409,494

[22] Filed: Sep. 19, 1989

[30] Foreign Application Priority Data

Sep. 22, 1988 [DE] Fed. Rep. of Germany ....... 3832145

[51] Int. Cl.⁵ .................... G01R 31/28; G01R 35/00
[52] U.S. Cl. .................................... 324/111; 324/130; 364/571.01; 364/571.05
[58] Field of Search .............. 364/571.01, 571.03, 364/571.02, 571.07, 573; 324/111, 130, 74; 341/141; 340/870.17

[56] References Cited

U.S. PATENT DOCUMENTS

| | | | |
|---|---|---|---|
| 4,200,933 | 4/1980 | Nickel et al. | 364/573 |
| 4,208,625 | 6/1980 | Piso | 324/130 |
| 4,229,703 | 10/1980 | Bustin | 341/158 |
| 4,364,027 | 12/1982 | Murooka | 341/141 |
| 4,418,392 | 11/1983 | Hata | 364/571.07 |
| 4,437,164 | 3/1984 | Branch,III | 364/571.07 |
| 4,553,091 | 11/1985 | Bristol | 324/115 |
| 4,581,714 | 4/1986 | Reid | 364/573 |
| 4,663,586 | 5/1987 | Swerlein et al. | 324/130 |
| 4,677,588 | 6/1987 | Malka et al. | 341/141 |
| 4,779,039 | 10/1988 | Baker | 324/130 |
| 4,799,005 | 1/1989 | Fernandes | 324/142 |
| 4,816,752 | 3/1989 | Michalski et al. | 324/130 |
| 4,829,236 | 5/1989 | Brenardi et al. | 324/74 |
| 4,839,819 | 6/1989 | Begin et al. | 364/571.01 |
| 4,884,021 | 11/1989 | Hammond et al. | 324/142 |
| 4,914,720 | 4/1990 | Knodle et al. | 250/346 |

FOREIGN PATENT DOCUMENTS 3634052 3/1989 Fed. Rep. of Germany .

Primary Examiner—Kenneth A. Wieder
Assistant Examiner—William J. Burns
Attorney, Agent, or Firm—Bernard Franzblau

[57] ABSTRACT

A method of and an apparatus for measuring small electrical signals with a computer-supported error-compensating measuring circuit (10) which includes a multiplexer (13), a following amplifier (15), an analog-to-digital converter (16) and a calculation device (17). The multiplexer has at least one pair of measuring signal input terminals (n−1, n) and one pair of zero volt input terminals (A, B) and connects them repeatedly to the following amplifier (15) for signal recording. Memories for digitized signals are present in order to correct, by means of the calculation device, actual measuring signals with correction values determined from a set of first measured signals so that a precise indication value is produced independent of offset errors and their variation.

19 Claims, 1 Drawing Sheet

METHOD AND APPARATUS FOR MEASURING SMALL ELECTRICAL SIGNALS

BACKGROUND OF THE INVENTION

The present invention relates to a method of measuring small electrical signals with a computer supported error-compensating measuring circuit and to an apparatus for carrying out the method.

Such a method and an apparatus for carrying out this method are known from the Philips Industrial Regulators of the types KS 4400 or KS 4450. These devices comprise, for example, a circuit for measuring large voltages through a voltage divider and/or a circuit for measuring currents with a shunt, or serve to record the temperature of, for example, a liquid and hence to measure thermoelement voltages. The voltage to be measured is connected to an input of a non-inverting amplifier, while the other input is connected to a zero potential. The signal is supplied to an analog-to-digital converter (A/D converter) following the amplifier and is then indicated in digital form. Through potentiometer adjustments, the beginning of the measuring range and the end of the measuring range are adjusted while simultaneously suppressing the measuring range. Also, through a potentiometer, in the case of the measurement of thermoelement voltages, the temperature compensation is adjusted, while for the necessary linearization of the signals a complicated analog circuit is provided, which is composed of several elements and linearizes the measuring range, for example, in five segments.

In this known method and apparatus, the high degree of complexity of the circuit and the associated effort in the development of such an apparatus are disadvantageous, especially when taking into account measuring range calculation instructions. Further, the amplifier error and the offset error of the amplifier and of the A/D converter must be compensated. Such a method and apparatus are not suitable for use in apparatuses of the lower price level, which are designated hereinafter also as so-called low-cost apparatuses. A further significant disadvantage is the sensitivity to the so-called long-time drift.

DE-OS 36 34 052 discloses a method and circuit arrangement for resistance determination. According to this circuit arrangement a circuit comprising a current source, a sensor resistor and a reference resistor is provided at the input side of a multiplexer. In order to determine the resistance value, i.e. in the end the voltage across this resistor, first this voltage is determined, after which a voltage across the resistor constituted by the lead and subsequently a voltage across the reference resistor is determined, in order to also record the current flowing in the circuit arrangement. Subsequently, the inputs of the instrument amplifier following the multiplexer are connected to zero potential and this value is digitized through an A/D converter for a calculation device. This measurement serves to determine deviations of the measured caused by temperature drift and other influential factors. By change-over of the multiplexer, these measurements are carried out repeatedly so that the required calcualtion can be carried out in the calculation device. By means of this method and circuit arrangement, respectively, offset and amplification errors can be taken into account.

SUMMARY OF THE INVENTION

An object of the present invention is to provide a method, which, with the use of low-cost elements and a calculation device, requires a minimum amount of hardware for the circuit and yields, taking offset errors and their variation into account, precise measurement results. According to the invention, this object is achieved by the features wherein first measurement results for a minimum and a maximum signal to be measured are determined and stored. Similarly for a first measurement result of a zero volt measurement. Each further measurement result and at least one further zero volt measurement are corrected by a subsequent comparison calculation with the stored first measurement results. The value of the measured electric signal is then indicated.

The method according to the invention mainly serves to measure electrical currents, voltages and thermoelement voltages. Inasmuch as an A/D converter with sufficient resolution and freedom of temperature drift represents a considerable cost factor, according to the invention a low cost A/D converter according to the dual slope principle is used. This converter is designated hereinafter as a so-called low-cost dual slope converter and is used in conjunction with other elements of the low-cost variety. The method according to the invention utilizes, in order to achieve precise measurement results, a calculation device also frequently used in inexpensive measureing circuits, especially the storage unit thereof, in a particular manner. It is based on the fact that besides adjustment points, i.e. calibration values or measuring range points or correction values associated therewith, the result of a so-called zero volt measurement, i.e. shortcircuit of a circuit used following a multiplexer and comprising an amplifier and the A/D converter, is first effected during the adjustment of the device in the manufacture and the resultant digitized signal values are stored in a calculation device. The calculation device then compares the result of a repeated actual zero volt measurement carried out during operation with the result of the stored zero volt measurement and corrects from this basic comparison the actual measurement values. Thus, freedom of offset errors and their variation is guaranteed in the A/D converter and amplifier. This means that a difference between the zero volt measurement during the adjustment and this measurement during operation is determined, which corresponds to the actual offset drift and serves for error compensation.

Although electrical currents also can be measured indirectly, for example via a shunt in accordance with the invention, it is assumed hereinafter that an electrical voltage potential is to be measured. The measurement of thermoelement voltages represents a particular case in the measurement of voltages because the voltage value resulting from a measurement of the terminal temperature must be subtracted from the determined thermoelement voltage value and subsequently a linearization takes place because of the non-linear relationship between the thermoelement voltage and the temperature. According to the invention, the measurement of the thermoelement voltage is determined while taking into account a measurement for a minimum and a maximum signal to be measured and a zero voltage measurement and the measurement of the terminal temperature is determined taking into account only correction values, which result from a measurement for a minimum and a maximum temperature signal to be measured.

An apparatus according to the invention for carrying out the method comprises, in cascade, a multiplexer, an amplifier following it, an analog-to-digital converter and a calculation device. The multiplexer has at least one pair of measuring signal input terminals and one pair of zero volt input terminals and repeatedly connects them to the following amplifier for signal recording. The calculation device includes a non-volatile memory for the first recorded signals digitized in the A/D converter. A further memory is provided, at least for the duration of the comparison calculation by the calculation device, for all further recorded and digitized signals.

This apparatus constitutes a measuring circuit having an input side to which are applied one or more voltages to be measured and whose output side passes on the measured input quantity to an indication and control unit. In accordance with a very simple embodiment, according to the invention, a precise measurement having a low offset drift of measurement signals with the use of low-cost elements can be obtained in that two switches are applied on the one hand on the input side to a measuring voltage and on the other hand are short-circuited and are connected on the output side to the inputs of an amplifier, preferably of a so-called instrument amplifier. This amplifier is followed by a so-called low-cost dual slope converter, i.e. a low cost A/D converter according to the dual slope method. The latter converts the analogue input signals with sufficient resolution into corresponding digital values. Again, the A/D converter is followed by a calculation device, which either comprises its own indication unit or can operate with such a unit or a control unit. According to a particular embodiment of the present invention, a high-performance so-called microcomputer comprising volatile and non-volatile memories can be used. The non-volatile memories in the end serve to store the correction values, which are required to compensate for long-time and temperature offset drifts. These correction values are either known a priori, for example the rise of the characteristic curve of a temperature-dependent resistor, or are determined by a first measurement, which thereafter serves for adjustment purposes. Preferably, during this first measurement, a mimimum and a maximum permissible value are used in order to fix at the same time the measuring range limits. A further essential correction value is determined from a first zero volt measurement and is stored. Further, the calculation unit includes at least one linearization program provided with at least one associated linearization table in order to eliminate any present non-linearities between the transmitter quantity and the measurement quantity.

In order to be able to process different measurement signals, the switch may be replaced by a multiplexer.

In order to guarantee during the measurement of the thermoelement voltage a temperature compensation, at least one further pair of input terminals is provided at the multiplexer and a terminal temperature recording circuit is connected to this pair. For this terminal temperature measurement, correction values also are determined and stored in the non-volatile memory, like the rise value of the characteristic curve of a temperature-dependent resistor used by way of example.

BRIEF DESCRIPTION OF THE DRAWINGS

An embodiment of the invention will now be described more fully with reference to the accompanying drawing, in which.

DESCRIPTION OF THE PREFERRED EMBODIMENTS

Figure 1:
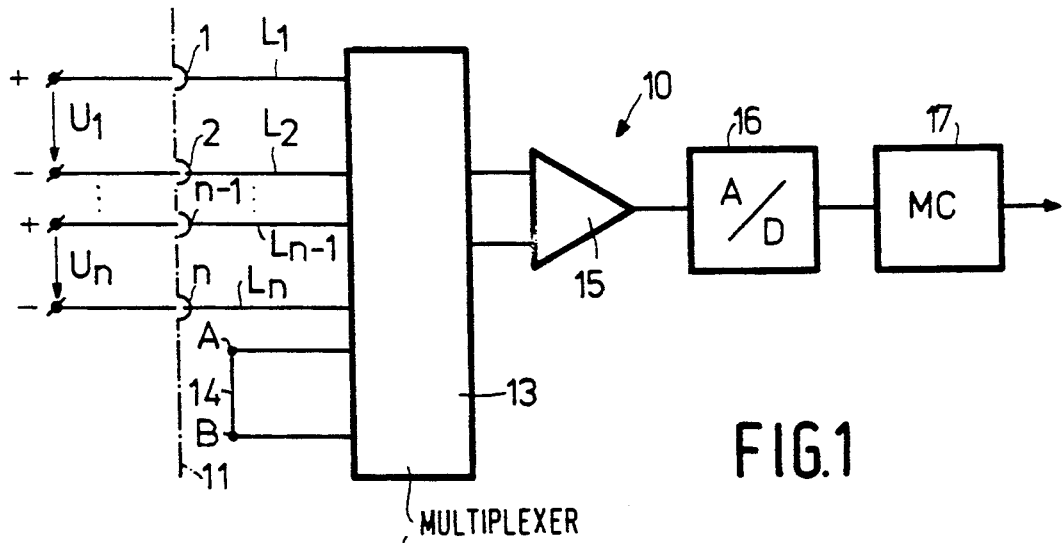
FIG. 1 shows an apparatus according to the invention for measuring small electrical signals.

FIG. 1 shows a measuring circuit 10 or apparatus according to the invention, which serves in principle for measuring an electrical voltage $U_1$ which is applied between terminals 1, 2 of a housing-mounted terminal strip 11. In order to measure several voltages, i.e. the voltage $U_1$ to the voltage $U_n$, input terminals 1, 2, ... n−1, n can be provided at the apparatus-mounted terminal strip 11. the terminals 1 to n are each connected through a lead $L_1$ to $L_n$ to the input terminals of a multiplexer 13. Of course, a shunt can be provided between the respective pairs of terminals in order to permit the measurement of a current. The multiplexer 13 has a further pair of input terminals A, B, which are interconnected through a bridge 14. If only one voltage $U_1$ is to be measured, the multiplexer 13 can be constructed as a double switch.

The multiplexer switches the various voltage signals $U_1$ to $U_n$ to be measured through to a following amplifier 15. Likewise, the zero voltage measuring signal, i.e. the signal between the input terminals A, B, of the multiplexer 13, is cyclically switched through. This can take place less frequently, i.e. not each time that a measuring signal is switched, if the zero voltage measuring signal must be switched through. The amplifier 15 is preferably constructed as an instrument amplifier. The amplifier 15 is followed by an A/D converter 16, preferably a low-cost dual slope converter. This converter converts the signals measured in analog form into corresponding digital signals and then supplies them to a calculation unit 17. The calculation device 17 may be a high-performance inexpensive microcomputer, in which non-volatile and volatile memories are present and various calculation programs are installed. The calculation device 17 may have its own indication unit or may supply data to such a unit or to a control device.

In order to carry out a measurement, the measuring circuit 10 must be adjusted in accordance with the invention. This is effected in that adjustment values designated hereinafter by F are stored in the memory unit of the calculation unit 17. Thus, for the beginning of the measuring range M (0% F) the corresponding digital value D (0% F) at the instant of the adjustment at a transmitter quantity of 0% is stored and for the end of the measuring range M (100% F) the corresponding digital value D (100% F) at the instant of the internal zero volt input voltage U (OVF) and the corresponding digital value D (OVF) at the instant of the adjustment are stored in the non-volatile memory. M relates to the measuring range, i.e. M indicates a transmitter quantity: current, voltage etc.

As already stated, with the adjustment the input quantities for 0% and 100% associated with the measuring range limits are applied to the input terminals 1 to n and the associated digital measurement value D (0% F) and D (100% F) are stored in the memory unit. The zero volt measurement is effected in a corresponding manner. An actual digital value D (akt) for a subsequent measurement then depends upon the measurement quantity in the following manner:

$$D(akt) = \frac{D(100\% \ F) - D(0\% \ F)}{M(100\% \ F) - M(0\% \ F)} \ M(akt) -$$

$$\frac{D(100\% \ F) - D(0\% \ F)}{M(100\% \ F) - M(0\% \ F)} \ M(0\% \ F) + D(0\% \ F) + \text{delta}$$

U (OV) indicates an internal zero volt measuring voltage during operation and D (OV) indicates the corresponding digital value. M (akt) indicates the actual measurement quantity. The added term delta represents an offset error additionally occurring since the adjustment of the measuring circuit 10. The value delta is therefore the difference D (OV) minus D (OVF). Thus, the following determination equation is obtained for the measurement value:

$$M(akt) = m(D(akt) - D(OV)) + b.$$

M can be the desired voltage or the desired current or can be present as a standard quantity. The parameters m, b of this linear equation can be determined by the adjustment value and coefficient comparison and serve as correction values for each following measurement. If a non-linear relation exists between a transmitter quantity and a measurement quantity, the ultimate physical value is then determined by means of a linearization program installed in the calculation device 17 and by means of a linearization table.

Figure 2:
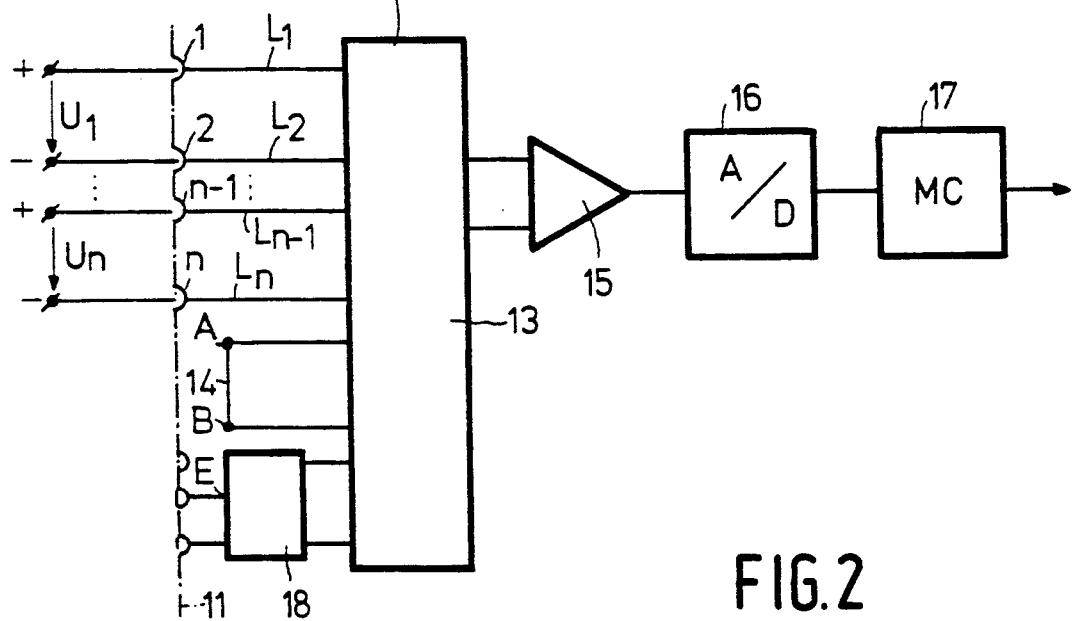
FIG. 2 shows an apparatus according to the invention for measuring thermoelement voltages.

FIG. 2 shows a preferred further embodiment of the measuring circuit 10 of FIG. 1 according to the invention. This further embodiment relates to a further pair of inputs of the multiplexer 13 for connection of the output terminals of a terminal temperature recording circuit 18. The latter serves for temperature compensation during measurement of thermoelement voltages at the terminals 1 to n. The terminal temperature recording circuit 18 has an input E, which also is thermally coupled so as to take into account a quick measurement sequence to all pairs of input terminals n−1, n. The terminal temperature recording circuit 18 can consist of a PTC resistor, a current source and a resistence network for linearizing the transmitter (T in U). the voltage is thus proportional to the terminal temperature of the measuring circuit 10. The rise of this relation is assumed to be mptc and is available through a memory of the calculation device 17. The further technical construction of the measuring circuit 10 of FIG. 2 corresponds to that of FIG. 1.

Figure 3:
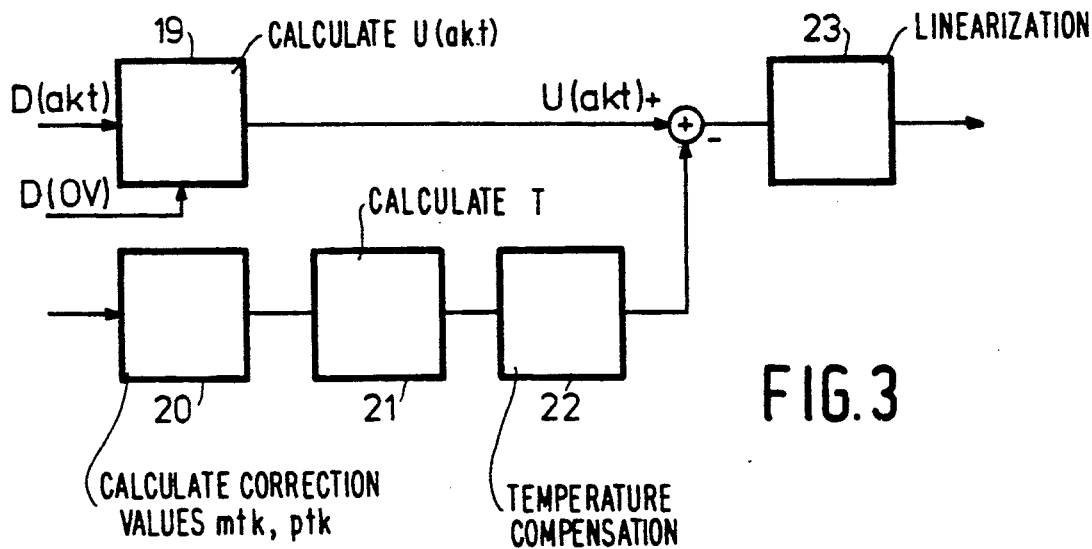
FIG. 3 shows diagrammatically a signal processing variation of the digitized signals in an apparatus as shown in FIG. 2.

FIG. 3 shows diagrammatically the calculation steps to be carried out for determining a sensor temperature. In the same manner as the calculation described in FIG. 1, via a member 19 the actual thermoelement voltage U (akt) is determined from the digitized actual voltage measurement value D (akt) and the digitized zero volt measurement value D (OV). For temperature compensation, the voltage value resulting from the terminal temperature measurement is to be subtracted therefrom. Because of the non-linear relation between a thermoelement voltage and a temperature, a linearization takes place in the member 23. At the output of this member 23, the sensor temperature is then available as an indication value. As far as the voltages $U_1$ to $U_n$ result from different kinds of thermoelements, different linearization tables can be installed in the calculation device 17, which are then correspondingly applied.

By exchange of the quantities M for corresponding quantities U, i.e. transmitter quantities in m volt, in the determination equations mentioned for FIG. 1, the determination equation is obtained:

$$U(akt) = mth(D(akt) - D(OV)) + bth$$

for the actual thermoelement voltage with the rise mth and the zero passage bth. This calculation is carried out in the member 19. The determination of the voltage resulting from the terminal temperature is carried out in the members 20, 21 and 22. In the member 20, first the voltage resulting from the PTC resistance of the terminal temperature recording circuit 18 is calculated. In the same manner as the inputs $U_1$ to $U_n$, a first adjustment measurement is carried out, while taking into account a minimum and a maximum value, without a zero voltage measurement, however. The correction values mtk and ptk result therefrom, which are stored in the memory of the calculation device 17. The member 20 then carries out a calculation according to the following formula:

$$Utk = mtk \ D(akt) + ptk.$$

As already stated, the rise mptc is already present in the memory of the calculation device 17 so that only one further point is required to be able to indicate a linear equation for the temperature. For this purpose, a known predetermined pair of values, for example the voltage U at a known adjustment temperature T, for example 25° C., can be used. The determination equation then is:

$$T = mptc(U(tk) - U(25)) + T(25).$$

This calculation is carried out in the member 21. The temperature value is to be adapted to the characteristic curve of the thermoelement for adaptation and later subtraction. As the temperature compensation is carried out through a voltage value and not through a temperature value and the relation between the temperature and voltage present due to the member 21 is non-linear, the compensation voltage is determined in the member 22 through the aforementioned linearization program. This value can then be subtracted from the thermoelement voltage and finally, by means of the linearization in the member 23, leads to the desired result.

According to a further preferred embodiment of the invention, a reference voltage for the maximum and the minimum signal to be measured can be provided, which serves for determining the long-time and temperature drift in order to correct the actual measuring signals according to the equation $$U(akt) =$$

$$\frac{U(100\% \ R) - U(0\% \ R)}{D(100\% \ R) - D(0\% \ R)} \ (D(akt) - D(0\% \ R)) + U(0\% \ R)$$

R characterizes the values associated with the reference voltage.

The features of the invention described in the above description, in the FIGS. 1, 2 and 3 and in the Claims can be essential to the realization of the invention in its various embodiments both individually and in arbitrary combinations.

We claim:

1. A method of measuring small electrical signals with a computer-supported error-compensating measuring circuit comprising, determining and storing first measurement results for a minimum and a maximum input signal to be measured between a first and a second signal input terminal (n−1, n) of at least one input of the measuring circuit, including determining and storing a first measurement result of a zero volt measurement, correcting each further measurement result by a signal measurement and only by a subsequent comparison calculation with the stored first measurement results and at least one further zero volt measurement, wherein a zero volt measurement is carried out during the measurement operation independently of the measurement of the electrical input signal and in that each time the last measurement is used for calculation, and indicating the value of a measured electrical signal.

2. A method of measuring small electrical signals with a computer-supported error-compensated measuring circuit comprising:
   determining and storing first measurement results for a minimum and a maximum input signal to be measured between a first and a second signal input terminal (n−1, n) of at least one input of the measuring circuit,
   determining and storing a first measurement result of a zero volt measurement,
   wherein said determining and storing steps further comprise,
   recording the electrical input signals at the signal input terminals of the measuring circuit, converting said signals into digital values, and supplying said digital values to a calculation device provided with memory means,
   said method further comprising:
   correcting each further measurement result by a signal measurement and only by a subsequent comparison calculation with the stored first measurement results and at least one further zero volt measurement,
   calculating in said calculation device an actual corrected indication value M(akt) according to the equation $M(akt) = m(D(akt) - D(OV)) + b$, where D(akt) is the corresponding digital value, D(OV) is the digital value of a respective zero volt measurement and m, b are constants derived from the stored first measurement results, and
   indicating the value of a measured electrical signal.

3. A method as claimed in claim 1, wherein, in the case of a non-linear relationship between the electrical signals and a corresponding transmitter quantity, the method further comprises, determining the ultimate physical value of the signal to be measured by means of an error-correcting linearization program which uses a linearization table.

4. A method as claimed in claim 2, which further comprises, determining in the calculation device a voltage U(akt) of a thermoelement, correcting said voltage for temperature compensation, subtracting from the temperature compensated voltage an additionally recorded compensation voltage, which corresponds to the terminal temperature, and converting the signal resulting therefrom via a linearization program provided with a linearization table into a value for the sensor temperature that can be indicated.

5. A method as claimed in claim 4, which comprises, determining the compensation voltage via a linearization program provided with a linearization table, and determining the respective input temperature value by means of a temperature recording circuit for the terminal temperature, a correction with measuring range limit values and a previously measured pair of values of voltage and temperature via the calculation device.

6. A method as claimed in claim 5, wherein for different types of thermoelements each time a corresponding linearization table is included in the calculation device and is used for determining the respective indication values.

7. A method as claimed in claim 1, wherein said small electrical signals comprise signal voltages in the millivolt range, and which method comprises, repeatedly determining measurement results for a reference signal corresponding to the minimum and the maximum signal to be measured and supplying said measurement results for a comparison calculation for drift correction of the actual measurement signals.

8. An apparatus for measuring small electrical signals having a computer-supported error-compensating measuring circuit comprising; a multiplexer, a following amplifier, an analog-to-digital converter and a calculation device coupled in cascade, characterized in that the multiplexer has at least one pair of measuring-signal input terminals (n−1, n) and a pair of zero volt input terminals (A, B) and connects said terminals repeatedly to the following amplifier for signal recording during a measurement operation and independently of each other, wherein the calculation device includes non-volatile memory means for storing the first recorded signals digitized in the analog-to-digital converter, and for all further recorded and digitized signals the calculation device includes further memory means provided at least for the duration of a correcting comparison calculation by the calculation device.

9. An apparatus as claimed in claim 8, characterized in that electrical signal voltages ($U_n$) are applied to pairs of measuring signal input terminals (n−1, n), in that the following amplifier comprises an instrument amplifier, in that the calculation device includes a comparison calculation program and at least one linearization program with at least one linearization table, and in that an interface is present for an indication device for indicating the determined physical signal value.

10. An apparatus as claimed in claim 9, characterized in that the electrical signal voltage at a pair of measuring signal input terminals (n−1, n) is a thermoelement voltage ($U_n$), and in that the multiplexer has a further pair of input terminals, which are connected to output terminals of a temperature recording circuit, which is thermally coupled on the input side to the measuring signal input terminals (n−1, n), in that the calculation device includes non-volatile memory means for the first recorded and digitized signals of the temperature recording circuit, i.e. signals at a minimum and a maximum signal value for a previously measured pair of values of temperature and voltage and for a previously known rise mptc of the temperature recording circuit, and volatile memory means for all further signals of the temperature recording circuit.

11. An apparatus as claimed in claim 8, characterized in that the multiplexer has pairs of input terminals to which a reference voltage corresponding to the minimum and the maximum signal to be measured is applied, and the calculation device has a program and memories for processing these signals.

12. An apparatus as claimed in claim 10, characterized in that the multiplexer has pairs of input terminals to which a reference voltage corresponding to the minimum and the maximum signal to be measured is applied, and the calculation device has a program and memories for processing these signals.

13. A method as claimed in claim 1, which comprises, determining via a calculation device a temperature corrected voltage U(akt) of a thermoelement, subtracting from said voltage U(akt) an additionally recorded compensation voltage, which corresponds to the terminal temperature, and converting a signal resulting therefrom via a linearization program having a linearization table into a sensor temperature value that can be indicated.

14. A method as claimed in claim 2, wherein, in the case of a non-linear relationship between the electrical signals and a corresponding transmitter quantity, the method further comprises, determining the ultimate physical value of the signal to be measured by means of an error-correcting linearization program having a linearization table.

15. A method as claimed in claim 2, which comprises, repeatedly determining measurement results for a reference signal corresponding to the minimum and the maximum signal to be measured and using said measurement results for a comparison calculation for drift correction of the actual measurement signals.

16. An error-compensated measuring apparatus for electric signals comprising:
    means for coupling in cascade a multiplexer, an amplifier, an analog/digital converter and a calculation device,
    wherein said multiplexer comprises at least one pair of signal input terminals (n−1, n) and a pair of zero volt input terminals (A, B), and means for periodically connecting said signal input terminals and said zero volt input terminals in a given sequence to input means of the amplifier during a signal measurement operation,
    wherein said calculation device comprises a memory device for storing, prior to a measurement operation, digital adjustment signals corresponding to first measurement input analog electric signals equivalent to a minimum and a maximum analog electric measurement signal at the signal input terminals and a further digital adjustment signal corresponding to a first zero volt measurement signal at the zero volt terminals, and means including a further memory device and a comparison means for correcting further measurement electric signals and further zero volt signals received at the signal inout terminals and at the zero volt terminals, respectively, during the measurement operation and as a function of said digital adjustment signals and said further digital adjustment signal thereby to derive corrected further measurement signals which are independent of offset errors and of changes in said offset errors.

17. A measuring apparatus as claimed in claim 16 wherein, during a measurement operation, said comparison means includes means for repeatedly comparing zero volt signals periodically received from said zero volt input terminals, via said multiplexer, said amplifier and said analog/digital converter, with the stored digital adjustment signal corresponding to the first zero volt measurement signal.

18. An error-compensated method of measuring electric signals comprising:
    determining and digitally storing, prior to a measurement operation, first measurement results for a minimum and a maximum input signal to be measured between at least a first and a second signal input terminal and a first measurement result of a zero volt measurement made at a third and fourth input terminal,
    deriving, during a measurement operation, further measurement results from input signals measured at said signal input terminals and further zero volt measurement results from further zero volt measurements made periodically at the third and fourth input terminals, and
    correcting said further measurement results by comparing the stored first measurement result and said further measurement results and by comparing the stored first zero volt measurement result with said further zero volt measurement results, and
    after the correcting operation, indicating the value of said input signal.

19. A method as claimed in claim 18 wherein said further zero volt measurements are carried out during a measurement operation independently of measurements carried out on input signals at said signal input terminals.

* * * * *